United States Patent
Zhou et al.

[11] Patent Number: 6,011,392
[45] Date of Patent: Jan. 4, 2000

[54] METHOD FOR REDUCING MAXWELL TERM ARTIFACTS IN FAST SPIN ECHO MR IMAGES

[75] Inventors: Xiaohong Zhou, Pewaukee; Matthew A. Bernstein; Gousheng Tan, both of Waukesha, all of Wis.

[73] Assignee: General Electric Company, Milwaukee, Wis.

[21] Appl. No.: 09/005,768

[22] Filed: Jan. 12, 1998

Related U.S. Application Data

[63] Continuation-in-part of application No. 08/831,684, Apr. 10, 1997.

[51] Int. Cl.$^7$ .................................................. G01V 3/00
[52] U.S. Cl. ........................ 324/309; 324/307; 324/314; 600/410; 600/412
[58] Field of Search .................................... 324/309, 307, 324/314; 600/412, 410, 459, 411

[56] References Cited

U.S. PATENT DOCUMENTS 4,848,138  11/1984  Bottomley et al. ..................... 324/307

OTHER PUBLICATIONS

Image Distortion in coronal Instant Images?, Society of Magnetic Resonance in Medicine, Book of Abstracts, vol. 1, Aug. 18–24, 1990, p. 457, Weisskoff, et al.

EPI Spatial Distortion in Non–Transverse Planes, Society of Magnetic Resonance in Medicine, Book of Abstracts, vol. 1, Aug. 12–18, 1989, p. 361, Coxon, et al.

Phase Errors In NMR Images, Society of Magnetic Resonance in Medicine, Book of Abstracts, vol. 2, Aug. 19–23, 1985, pp. 1037–1038, D. G. Norris.

Nonaxial Whole–Body Instant Imaging, MRM 29:796–803 (1993),Weisskoff, et al.

Reduction of Concomitant Field Gradient Effects by Main Field Alternation, Proceedings of the Society of Magnetic Resonance, vol. 1, Aug. 19–25, 1995, p. 314.

Concomitant Magnetic Field Gradients and their effects on Image at Low Magnetic Field Strengths, Mag. Res. Imag., vol. 8, pp. 33–37, 1990, Norris, et al.

On Phase Artifacts of High–Field Fast Spin–Echo Images, Proceedings of the Society Of Magnetic Resonance in Medicine, vol. 3, p. 1248, New York, NY, 1993, Zhou, et al.

*Primary Examiner*—Christine K. Oda
*Assistant Examiner*—Buij B. Shrinvastav
*Attorney, Agent, or Firm*—Quarles & Brady; Christian G. Cabou; Phyllis Y. Price

[57] ABSTRACT

Fast spin echo pulse sequences are adjusted to reduce, or eliminate image artifacts caused by Maxwell terms arising from the linear imaging gradients. The waveforms of the slice selection, phase encoding and readout gradients are adjusted in shape, size or position to eliminate or reduce the phase error caused by the spatially quadratic Maxwell terms.

2 Claims, 4 Drawing Sheets

METHOD FOR REDUCING MAXWELL TERM ARTIFACTS IN FAST SPIN ECHO MR IMAGES

This application is a continuation-in-part of the U.S. patent application Ser. No. 08/831,684, filed on Apr. 10, 1997 and entitled "Method For Reducing Maxwell Term Artifacts in Fast Spin Echo MR Images".

BACKGROUND OF THE INVENTION

The field of the invention is nuclear magnetic resonance imaging methods and systems. More particularly, the invention relates to correction of image artifacts caused by "Maxwell terms" produced by imaging gradients in MRI systems.

When a substance such as human tissue is subjected to a uniform magnetic field (polarizing field $B_0$), the individual magnetic moments of the spins in the tissue attempt to align with this polarizing field. They also precess about it at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation field $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One method for producing images rapidly is the Rapid Acquisition Relaxation Enhanced (RARE) sequence which was described by J. Hennig et al. in an article in *Magnetic Resonance in Medicine* 3,823–833 (1986) entitled "RARE Imaging: A Fast Imaging Method for Clinical MR." The RARE sequence, as well as its variant known as a fast spin echo ("FSE") sequence, utilizes a Carr-Purcell-Meiboom-Gill RF pulse train, to produce multiple spin echo signals from a single excitation in which each acquired echo signal is individually phase encoded. Each pulse sequence, or "shot," therefore results in the acquisition of a plurality of views. In the original RARE sequence, the number of views can be as many as 128. Thus, sufficient data for image reconstruction can be obtained in a single shot. In most clinical applications, however, a plurality of shots are typically employed to acquire a complete data set, as described by R. V. Mulkern et al. in *Magnetic Resonance Imaging*, Vol. 8, pp. 557–566, 1990.

It is well known that imperfections in the linear magnetic field gradients ($G_x$, $G_y$, and $G_z$) produce artifacts in the reconstructed images. It is a well known problem, for example, that eddy currents produced by gradient pulses will distort the magnetic fields and produce image artifacts. Methods for compensating for such eddy current errors are also well known as disclosed, for example, in U.S. Pat. Nos. 4,698,591; 4,950,994; and 5,226,418.

It is also well known that the gradients may not be perfectly uniform over the entire imaging volume, which may lead to image distortion. Methods for compensating this non-uniformity are well known, and for example, are described in U.S. Pat. No. 4,591,789.

Other than uncompensated eddy current errors, and gradient non-uniformity errors that escape correction, it can be assumed that the magnetic field gradients ($G_x$, $G_y$ and $G_z$) produce linear magnetic fields exactly as programmed, thus spatially encoding the NMR data accurately. With these gradients, the overall magnetic field at location (x,y,z) is conventionally given as $B_0+G_x x+G_y y+G_z z$, and the direction of the field is usually taken to be along the z-axis. This description, however, is not exactly correct. As long as a linear magnetic field gradient is applied, the overall magnetic field is nutated away from the z-axis and its amplitude exhibits higher-order spatial dependencies ($x^2$, $y^2$, $z^2$, $x^2 z$, . . . ). These phenomena are a direct consequence of the Maxwell equations which require that the overall magnetic field satisfy the following two condition: $\vec{\nabla} \cdot \vec{B} = 0$ and $\vec{\nabla} \times \vec{B} = \vec{0}$. The higher-order magnetic fields, referred to as "Maxwell terms" (or Maxwell fields), represent a fundamental physics effect, and are not related to eddy currents or imperfection in hardware design and manufacture. Although Maxwell terms have been known for at least a decade, their effect on imaging has been largely ignored because of their minute consequences under conventional imaging conditions.

SUMMARY OF THE INVENTION

The image artifacts in an FSE sequence due to Maxwell terms are suppressed by altering the gradient waveforms. In the slice selection direction gradient waveforms are made symmetrical about refocusing pulses where preferred, and for the first refocusing pulse where such symmetry is not preferred, one of the crusher gradient pulses is adjusted in size to eliminate artifacts due to the self-squared Maxwell (i.e. $x^2$, $y^2$ or $z^2$) term. The crusher gradient lobes after the first refocusing RF pulse are subsequently equalized to the altered crusher gradient lobe. Artifacts due to the self-squared terms arising from the phase encoding gradient pulses are minimized by reducing the amplitude thereof to the minimum amount possible within the time period allowed to play each out. The artifacts due to the self-squared Maxwell terms arising from the readout gradient are eliminated by adjusting the magnitude of the pre-phasing lobe of the readout gradient.

The artifacts caused by the quadratic-cross Maxwell terms (i.e., xz and yz terms) are generally small and can often be removed using regular FSE phase correction techniques, as described in U.S. Pat. No. 5,378,985 (January, 1995). In cases where such terms become significant and cannot be removed using the existing phase correction techniques, the position of the gradient waveforms can be adjusted so that they do not overlap (or minimally overlap) in the pulse sequence.

GENERAL DESCRIPTION OF THE INVENTION

Figure 1:
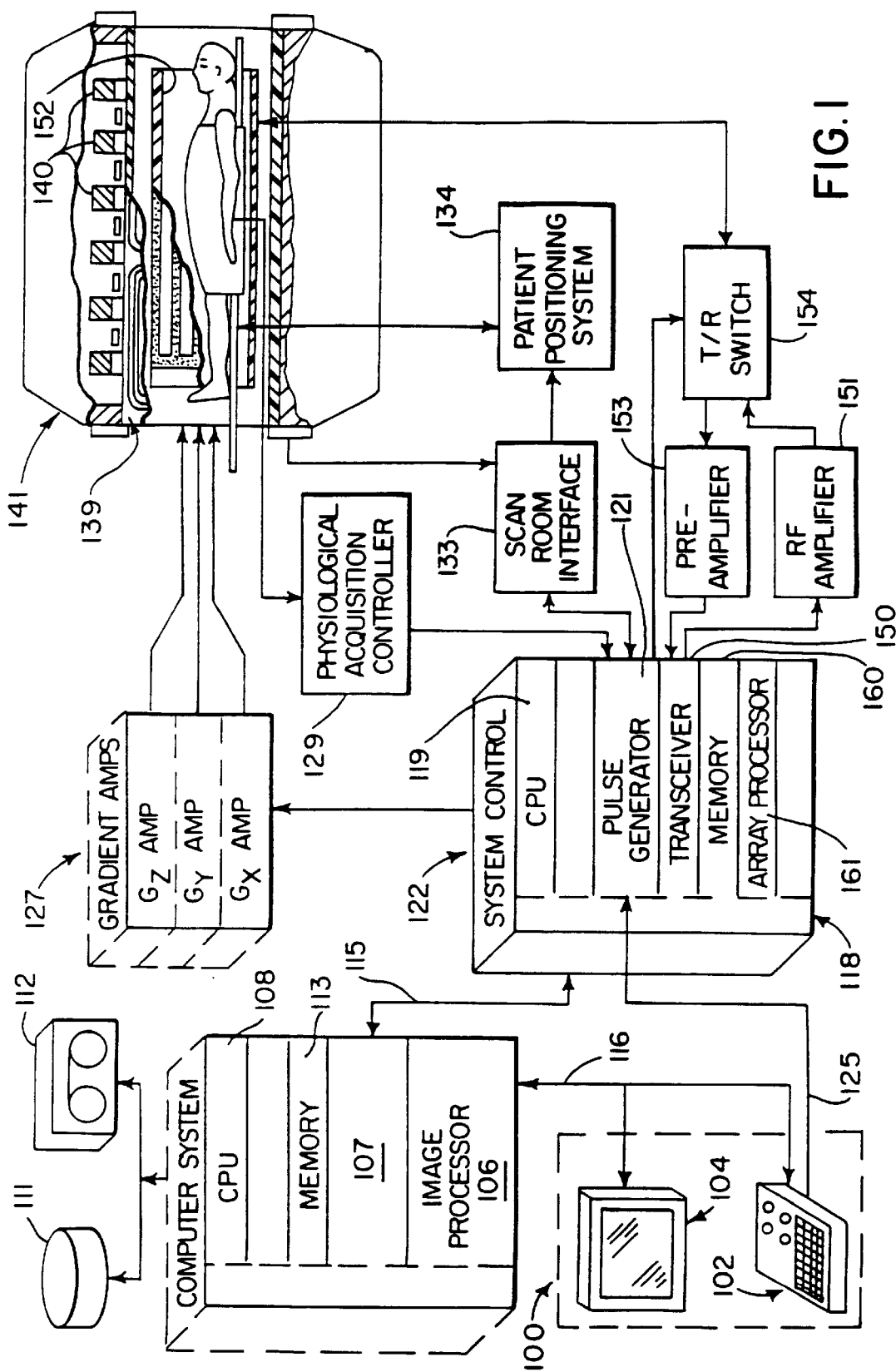
FIG. 1 is a block diagram of an MRI system which employs the present invention.

The Maxwell terms are basically the higher-order spatial gradients (second order, third order, etc.) produced by the applied linear magnetic field gradients (x, y and z-gradients). These terms can be directly derived from the Maxwell equations. According to the Maxwell equations, a magnetic field $\vec{B}$ must satisfy the following two conditions:

$$\vec{\nabla} \cdot \vec{B} = 0 \text{ (divergence equation)}, \tag{1a}$$

$$\vec{\nabla} \times \vec{B} = \mu_0 \varepsilon_0 \frac{\partial \vec{E}}{\partial t} + \mu_0 \vec{J} \text{ (curl equation)}, \tag{1b}$$

where $\vec{\nabla}$ is the derivative operator ($\vec{\nabla} \equiv \hat{i}\partial/\partial x + \hat{j}\partial/\partial y + \hat{k}\partial/\partial z$), $\vec{E}$ is the electric field, $\vec{J}$ is the current density, and $\mu_0$ and $\varepsilon_0$ are the magnetic permeability and the electric permittivity of the free space, respectively. If there is no current density and the electric field is static, equation 1b reduces to:

$$\vec{\nabla} \times \vec{B} = 0. \tag{1c}$$

From equations 1a and 1c, we obtain:

$$\frac{\partial B_x}{\partial x} + \frac{\partial B_y}{\partial y} + \frac{\partial B_z}{\partial z} = 0, \tag{2}$$

$$\frac{\partial B_x}{\partial y} = \frac{\partial B_y}{\partial x}, \tag{3a}$$

$$\frac{\partial B_y}{\partial z} = \frac{\partial B_z}{\partial y}, \tag{3b}$$

$$\frac{\partial B_z}{\partial x} = \frac{\partial B_x}{\partial z}. \tag{3c}$$

The above 4 equations 2 and 3a–c contain a total of 9 partial derivatives, among which only 5 are independent. Our next task is to select these five independent variables. Recognizing that $$\frac{\partial B_z}{\partial x} \equiv G_x, \frac{\partial B_z}{\partial y} \equiv G_y, \frac{\partial B_z}{\partial z} \equiv G_z$$

($G_x$, $G_y$, and $G_z$ are the linear gradients), we can readily choose $G_x$, $G_y$, and $G_z$ as the first three independent variables. For a radially symmetric $G_z$-field in cylindrical coordinates $\partial B_x/\partial x$ and $\partial B_y/\partial y$ should be identical. However, to cover a more general case, we choose a dimensionless symmetry parameter $\alpha$ as the fourth independent variable:

$$\alpha \equiv -\frac{\partial B_x/\partial x}{G_z}, \text{ or } 1 - \alpha \equiv -\frac{\partial B_y/\partial y}{G_z}. \tag{4a-b}$$

The last independent variable can be conveniently chosen as (based on equation 3a):

$$g \equiv \frac{\partial B_x}{\partial y} = \frac{\partial B_y}{\partial x}. \tag{5}$$

At this point, all the partial derivatives described in equations 2 and 3 can be expressed using the 5 independent variables $G_x$, $G_y$, $G_z$, $\alpha$, and g:

$$\begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} = \begin{bmatrix} -\alpha G_z & g & G_x \\ g & -(1-\alpha)G_z & G_y \\ G_x & G_y & G_z \end{bmatrix}. \tag{6}$$

With all the terms, the overall magnetic field becomes:

$$\vec{B} = \hat{i}B_x + \hat{j}B_y + \hat{k}B_z, \tag{7}$$

where, to first order, $$\begin{bmatrix} B_x \\ B_y \\ B_z - B_0 \end{bmatrix} = \begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} \begin{bmatrix} x \\ y \\ z \end{bmatrix} \tag{8}$$

$$= \begin{bmatrix} -\alpha G_z & g & G_x \\ g & -(1-\alpha)G_z & G_y \\ G_x & G_y & G_z \end{bmatrix} \begin{bmatrix} x \\ y \\ z \end{bmatrix}.$$

The above equations have two important implications. First, the $B_0$-field is no longer aligned along the z-axis because of the transverse fields $B_x$ and $B_y$. Second, the amplitude of the $B_0$ field is not simply given by $B = B_0 + G_x x + G_y y + G_z z$, but instead by $$B(x, y, z) = \sqrt{B_x^2 + B_y^2 + B_z^2} \tag{9}$$

($B_0 + G_x x + G_y y + G_z z$ merely represents the z-component of the overall field). If we perform three sequential Taylor series expansions on equation 9 with respect to x, y, and z, respectively, it can be seen that the magnetic field not only has its regular zeroth and first order spatial dependencies, but also shows higher-order spatial components. The result of the Taylor expansion to the second order is given by equation 10:

$$B = B_0 + G_x x + G_y y + G_z z + \frac{1}{2B_0}[\alpha^2 G_z^2 + g^2]x^2 + \tag{10}$$

$$\frac{1}{2B_0}[(1-\alpha)^2 G_z^2 + g^2]y^2 + \frac{1}{2B_0}[G_x^2 + G_y^2]z^2 - \frac{gG_z}{B_0}xy +$$

$$\frac{1}{B_0}[gG_x - (1-\alpha)G_yG_z]yz + \frac{1}{B_0}[gG_y - \alpha G_xG_z]xz.$$

(The Taylor expansion needs to be carried out to a sufficiently high order to obtain the result in equation (10). For example, the term $(G_xx+G_yy+G_zz)^2$ is canceled by an equal and opposite term from the higher order expansion.) For gradient systems used in most MRI systems, we have g=0, and $\alpha \approx \frac{1}{2}$ (due to the cylindrical symmetry). Under these conditions, equation 10 is simplified to:

$$B = B_0 + G_xx + G_yy + G_zz + \frac{1}{8B_0}G_z^2x^2 + \frac{1}{8B_0}G_z^2y^2 + \frac{1}{2B_0}[G_x^2+G_y^2]z^2 - \frac{1}{2B_0}G_yG_zyz - \frac{1}{2B_0}G_xG_zxz. \quad (11)$$

If the MR system in question does not have cylindrical symmetry or g is non-zero, then the appropriate values of g and $\alpha$ can be used in equation 10 instead.

Equations 10 and 11 indicate that, whenever a linear magnetic field gradient is applied, higher-order gradient fields will be produced to satisfy the Maxwell equations. These higher-order gradient fields are referred to as the "Maxwell terms", or "Maxwell fields."

With the inclusion of the Maxwell terms, the two-dimensional NMR signal equation becomes:

$$S(k_x, k_y) = \iint_{x,y} \rho(x,y)e^{-i(k_xx+k_yy)}e^{-i\phi_M}\,dx\,dy, \quad (12a)$$

$$\phi_M = \gamma \int_t B_M(G_x, G_y, G_z, x, y, z)\,dt', \quad (12b)$$

$$B_M = \frac{1}{8B_0}G_z^2x^2 + \frac{1}{8B_0}G_z^2y^2 + \frac{1}{2B_0}[G_x^2+G_y^2]z^2 - \frac{1}{2B_0}G_yG_zyz - \frac{1}{2B_0}G_xG_zxz. \quad (12c)$$

where $B_M$ is the Maxwell higher-order terms of the magnetic field and $\phi_M$ is the associated phase error, which we call the "Maxwell phase". Let us first examine the term of equation (12c), which has $z^2$ spatial dependence. This term is particularly important in sagittal FSE spine images with a large FOV (e.g. 48 cm). (To give a concrete example, here we consider a large field of view sagittal image, obtained with a superconducting magnet which has the z-direction aligned with the long axis of the patient. The considerations and method described here apply also to large field of view coronal scans, and oblique scans which lie substantially in the coronal or sagittal planes. The methods described here can also apply to scans with smaller fields of view but large offsets from the gradient isocenter. The analysis can also be readily generalized to vertical-field magnets where the z-axis corresponds to the anterior/posterior of the patient.) Therefore z in equation (12c) can be as large as ±24 cm. In sagittal images the slice-selection direction is along physical x, and the gradient $G_x$ contributes to the Maxwell term with $z^2$ spatial dependence. If the readout direction is along the superior/inferior (S/I) direction (i.e. the physical z-axis), then the phase-encoding gradient $G_y$ also contributes to the $z^2$ Maxwell term. If, however, the phase and frequency directions are swapped, then the readout gradient contributes to the $z^2$ Maxwell term instead of the phase-encoding gradient.

Figure 4:
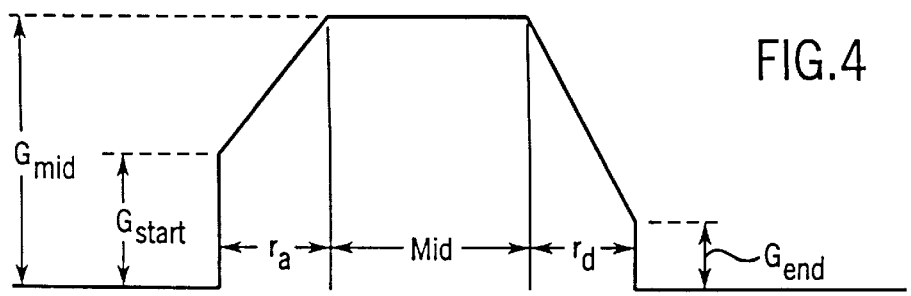
FIG. 4 is a graphic representation of a trapezoidal gradient pulse.

Consider an arbitrary trapezoidal gradient lobe as shown in FIG. 4. The lobe has area $$A_L = \int G(t)\,dt \quad (13)$$

$$= r_a G_{start} + \frac{G_{mid}}{2} + Mid\,G_{mid} + r_d\frac{G_{mid}+G_{end}}{2}.$$

The self-squared integral, which is used to calculate the self-squared phase errors is $$M_L = \int G^2(t)\,dt = r_aG_{start}^2 + G_{start}G_{mid} + \frac{G_{mid}^2}{3} + Mid\,G_{mid}^2 + r_d\frac{G_{end}^2+G_{end}G_{mid}+G_{mid}^2}{3}. \quad (14)$$

Figure 5:
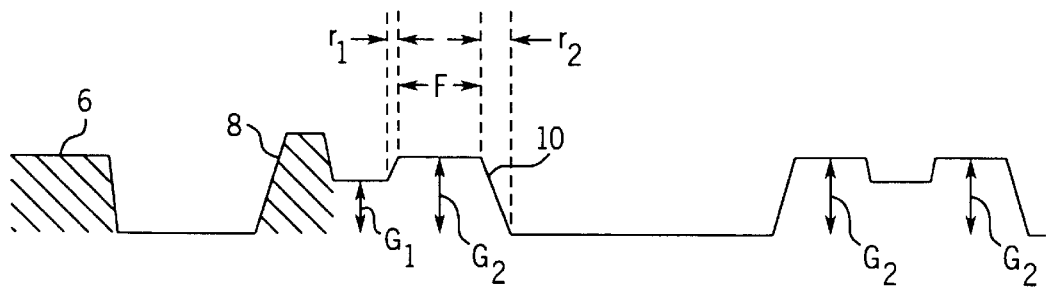
FIG. 5 is a graphic representation of the improved gradient pulses in the slice selection direction according to the preferred embodiment of the invention, which is employed in the FSE sequence of FIG. 3.

Next consider the FSE slice selection waveform of FIG. 5. The two cross-hatched lobes 6 and 8 are the right half of the 90° slice selection gradient, and the left side crusher gradient for the first 180°, respectively. These gradient lobes 6 and 8 are determined by imaging considerations such as slice thickness, excitation bandwidth, and FID reduction. Using equations (13) and (14), the total area and Maxwell term of the two cross-hatched gradient lobes 6 and 8 can be readily calculated. The goal is to design a right crusher gradient lobe 10 for the first 180° refocusing pulse that simultaneously nulls the area and the Maxwell term of the gradient lobes 6 and 8 by exploiting the phase reversal effect of the RF refocusing pulse.

Let the total cross-hatched region of gradient lobes 6 and 8 have area A, and let its total Maxwell term be M. Since the area of gradient lobe 10 must balance A, equation (13) in conjunction with FIG. 5 yields:

$$A = r_1G_1 + \frac{G_2}{2} + G_2F + r_2\frac{G_2}{2}. \quad (15)$$

$G_1$ is fixed by imaging considerations (180° pulse bandwidth and slice thickness), but $G_2$ can be varied. We assume slew-rate limited ramps, so that $$r_1 = \frac{r(G_2-G_1)}{h}, \quad (16)$$

$$r_2 = \frac{rG_2}{h},$$

where h is the maximum gradient amplitude, and r is the rise-time from 0 to h. Substituting equation (16) into equation (15), we can express the area relation as $$A = G_2F + \frac{r}{2h}(2G_2^2 - G_1^2). \quad (17)$$

Similarly, in order for the right crusher lobe 10 to balance the Maxwell term M, equations (14) and (16) in conjunction with FIG. 5 yield:

$$M = G_2^2F + \frac{r}{3h}(2G_2^3 - G_1^3). \quad (18)$$

We can solve for $G_2$ by eliminating F from equations (17) and (18). Multiplying equation (17) by $G_2$, and subtracting the result from equation (18), a cubic equation in $G_2$ results:

$$G_2^3 - G_2\left(\frac{3G_1^2}{2} + \frac{3Ah}{r}\right) + \left(G_1^3 + \frac{3Mh}{r}\right) = 0. \qquad (19)$$

Note that F has been eliminated from equation (19). Thus the strategy is to solve the cubic equation for $G_2$, and then to choose F so that the area constraint in equation (17) is satisfied.

The cubic equation can be solved using standard methods. There are three roots, and at least one root must be real. The first step to solve the cubic equation is to set $$q = -\left(\frac{G_1^2}{2} + \frac{Ah}{r}\right), \qquad (20)$$

$$p = -\frac{1}{2}\left(G_1^3 + \frac{3Mh}{r}\right). \qquad (21)$$

If $q^3+p^2 \leq 0$, then all three roots are real. If $q^3+p^2 > 0$ then there is one real root, and a pair of conjugate roots. Only real roots are physically meaningful. The roots $z_1$, $Z_2$, and $Z_3$, can be expressed in terms of q and p:

$$s_1 = \sqrt[3]{p + \sqrt{q^3 + p^2}}, \qquad (22)$$

$$s_2 = \sqrt[3]{p - \sqrt{q^3 + p^2}},$$

$$z_1 = s_1 + s_2,$$

$$z_2 = -\frac{s_1 + s_2}{2} + \frac{i\sqrt{3}}{2}(s_1 - s_2),$$

$$z_3 = -\frac{s_1 + s_2}{2} - \frac{i\sqrt{3}}{2}(s_1 - s_2).$$

where $$i = \sqrt{-1}.$$

We assume that $G_1$ is positive. In order to make efficient use of the gradients, the crusher amplitude $G_2$ should be positive in order to de-phase any FID's from the first 180° pulse. $G_2$, however, cannot exceed the maximum gradient amplitude, so $0 \leq G_2 \leq h$. To avoid large increases in echo spacing, we apply the further constraint that $G_1 \leq G_2$. We, therefore seek real roots which lie in the following range $$G_1 \leq G_2 \leq h. \qquad (23)$$

If there are multiple roots that satisfy equation (23), then the largest is selected.

For all of the clinically relevant protocols that we have examined, we have found three real roots to equation (19). Some general properties of cubic equations give us some insight into these roots. Since the coefficient of $G_2^2$ is zero in equation (19), it must be true that the sum of the three roots is zero. Also, since the constant term in equation (19) is positive, the product of the three roots must be negative. Therefore, we conclude that when there are three real roots, two are positive, and one is negative. We have found that one of the positive roots satisfies equation (23) for all clinically relevant protocols that we have investigated.

Referring still to FIG. 5, once an acceptable solution for $G_2$ is found, that root is used in conjunction with equation (17) to solve for the crusher flat-top duration F. The ramp durations are then determined from equation (16). Thus the Maxwell-compensated right crusher is fully determined, and the $G_x \rightarrow z^2$ Maxwell term is compensated for the first echo.

With the reshaped right crusher gradient for the first refocusing pulse and the symmetrized gradients surrounding the other refocusing pulses, it can be readily seen that the Maxwell phase errors can be eliminated for the primary spin echoes. However, for the stimulated echoes, Maxwell phase errors can still exist due to the difference between the self-squared phase caused by the first right crusher gradient and those produced by the subsequent crusher gradients. To ensure that both primary echoes and the stimulated echoes are free from the Maxwell phase errors, we use a "waveform symmetrization" strategy to equalize all the crusher gradients, to the newly reshaped right crusher of the first refocusing pulse, starting from the left crusher of the second refocusing pulse this subtle, but important, change is critical to obtain high quality FSE images. Of course, many other methods can be used to achieve the phase coherence between the primary and the stimulated echoes. For example, the left crusher of the first refocusing pulse, instead of the right crusher, can be reshaped to cancel the Maxwell phase, while keeping all other crushers unchanged.

Figure 7:
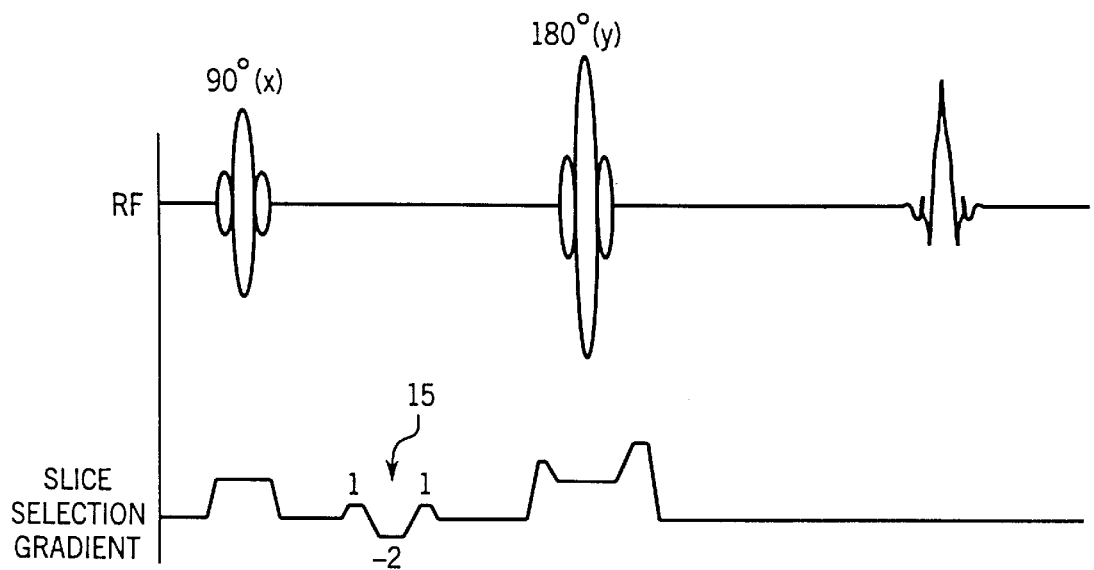
FIG. 7 is a graphic representation of an alternative way to adjust the slice-selection gradient to remove the Maxwell terms by adding an extra velocity compensated pulse, i.e., a (1, −2, 1) pulse, with zero area.

An alternative design strategy, which does not require changing the crusher lobe 10, is to add a separate gradient waveform between the 90° RF pulse and the first refocusing pulse, or between the first and the second refocusing RF pulses, depending on the relative amplitude of the Maxwell terms. Such a gradient waveform should have a net area of zero, but the integral of its magnitude squared should cancel out the Maxwell self-squared terms as described above. A bipolar (1, -1) gradient waveform may be used, or alternatively, a velocity compensated (1, -2, 1) gradient waveform may be used as shown in FIG. 7 at 15.

The Maxwell term from the phase encoding gradient in an FSE sequence can also contribute to ghosting in large FOV images. For example, a phase-encoding gradient in the physical y-axis can cause a $z^2$ Maxwell term in sagittal images, leading to artifacts in locations with large z values. Since the phase encoding amplitude must change from echo-to-echo, it is difficult to exactly null its Maxwell term. Instead we reduce it to acceptable levels by de-rating its target amplitude. According to equations (13) and (14), when the area $A_L$ is held constant, the Maxwell term of a trapezoidal lobe is approximately proportional to the gradient amplitude. We therefore reduce the amplitude by stretching the duration of each phase encoding lobe in the FSE pulse sequence as much as possible without increasing the minimum echo spacing. This maximum acceptable duration is usually determined by the duration of the crushers. Increasing the phase-encoding gradient pulse width while keeping the gradient area constant does not necessarily augment the quadratic-cross Maxwell term caused by the product of the slice-selection and the phase-encoding gradients. For example, if we assume that the slice-selection gradient is a constant for the duration when the phase-encoding gradient is played out, the quadratic-cross Maxwell terms will be exactly the same before and after the "stretching" of the phase-encoding pulse.

Similar to the slice-selection and the phase-encoding gradients, the FSE readout gradient can also produce a Maxwell field which introduces phase-errors and the associated image artifacts. The phase errors arise primarily from the non-identical waveforms used for the pre-phasing readout gradient and the readout gradient at the first echo. From the center of the first echo onward, the readout gradient waveforms are symmetrical with respect to each refocusing RF pulse. Thus, the phase error is canceled by the phase reversal effect associated with the RF refocusing pulses.

To remove the self-squared Maxwell effect induced by the readout gradient, the pre-phasing readout gradient is modified so that the gradient area requirement in equation (24) and the Maxwell phase cancellation requirement in equation (25) are simultaneously satisfied:

$$\int_t g_{rp}(t)dt = \int_{t'} g_{ro}(t')dt', \quad (24)$$

$$\int_t g_{rp}^2(t)dt = \int_{t'} g_{ro}^2(t')dt'. \quad (25)$$

Figure 6:
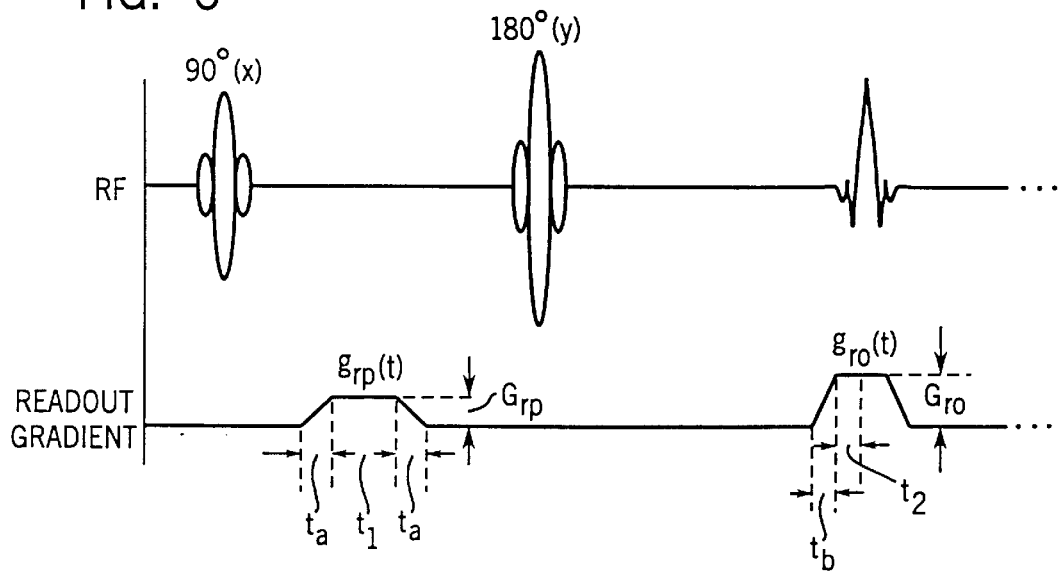
FIG. 6 is a graphic representation of the improved gradient pulses in the readout direction according to the preferred embodiment of the invention, which is employed in the FSE sequence of FIG. 3.

In the above equations, $g_{rp}(t)$ and $g_{ro}(t')$ are the waveforms of the pre-phasing and the first half of the first readout gradients, respectively as shown in FIG. 6. The integrals on the left cover the entire pre-phasing gradient, and the integrals on the right cover a time range from the beginning to the center of the first readout gradient lobe. For the timing parameters given in the example shown in FIG. 6, equations (24) and (25) can be expressed as:

$$G_{rp}(t_1 + t_a) = G_{ro}\left(t_2 + \frac{t_b}{2}\right), \quad (26)$$

$$G_{rp}^2\left(t_1 + \frac{2t_a}{3}\right) = G_{ro}^2\left(t_2 + \frac{t_b}{3}\right). \quad (27)$$

To define the pre-phasing gradient waveform that satisfies the above equations, three parameters must be determined: $t_1$, $t_a$, and $G_{rp}$. If we assume that the ramp times $t_a$ and $t_b$ are slew-rate limited, then $t_a$ and $t_b$ can be related to the maximum gradient h, the rise time r, and the corresponding gradient amplitude by:

$$t_a = \frac{rG_{rp}}{h}, \quad (28a)$$

$$t_b = \frac{rG_{ro}}{h}. \quad (28b)$$

Substituting equations (28a) and (28b) into equations (26) and (27), one obtains:

$$G_{rp}\left(t_1 + \frac{rG_{rp}}{h}\right) = G_{ro}\left(t_2 + \frac{rG_{ro}}{2h}\right), \quad (29)$$

$$G_{rp}^2\left(t_1 + \frac{2rG_{rp}}{3h}\right) = g_{ro}^2\left(t_2 + \frac{rG_{ro}}{3h}\right). \quad (30)$$

Combining the above two equations to eliminate $t_1$, one has:

$$G_{rp}^3 - \frac{6hG_{ro}t_2 + 3rG_{ro}^2}{2r}G_{rp} + G_{ro}^2\left(\frac{3ht_2}{r} + G_{ro}\right) = 0. \quad (31)$$

Define:

$$u = -\frac{6hG_{ro}t_2 + 3rG_{ro}^2}{2r},$$

$$v = G_{ro}^2\left(\frac{3ht_2}{r} + G_{ro}\right).$$

Equation (31) reduces to:

$$G_{rp}^3 + uG_{rp} + v = 0 \quad (32)$$

The three solutions to the cubic equation are:

$$G_{rp,1} = \sqrt[3]{-\frac{v}{2} + \sqrt{\left(\frac{v}{2}\right)^2 + \left(\frac{u}{3}\right)^3}} + \sqrt[3]{-\frac{v}{2} - \sqrt{\left(\frac{v}{2}\right)^2 + \left(\frac{u}{3}\right)^3}}, \quad (33a)$$

$$G_{rp,2} = \omega\sqrt[3]{-\frac{v}{2} + \sqrt{\left(\frac{v}{2}\right)^2 + \left(\frac{u}{3}\right)^3}} + \omega^2\sqrt[3]{-\frac{v}{2} - \sqrt{\left(\frac{v}{2}\right)^2 + \left(\frac{u}{3}\right)^3}}, \quad (33b)$$

$$G_{rp,3} = \omega^2\sqrt[3]{-\frac{v}{2} + \sqrt{\left(\frac{v}{2}\right)^2 + \left(\frac{u}{3}\right)^3}} + \omega\sqrt[3]{-\frac{v}{2} - \sqrt{\left(\frac{v}{2}\right)^2 + \left(\frac{u}{3}\right)^3}}, \quad (33c)$$

where $$\omega = \frac{1}{2}\left(-1 + i\sqrt{3}\right).$$

Among the three solutions, at least one is real as discussed previously for the crusher gradient. Thus, a useful solution can always be obtained. In cases where there are multiple real solutions, one can, for example, choose the largest solution within the gradient amplitude limit so that the echo time can be minimized. Once $G_{rp}$ is determined, the flat-top gradient duration can be calculated from equation (29) and the ramp time can be determined using equation (28a). With the new pre-phasing gradient determined by $G_{rp}$, $t_1$ and $t_a$, the phase error introduced by the Maxwell term arising from the readout gradient is removed at the center of each echo.

Using the aforementioned techniques, the effects of the self-squared Maxwell terms can be completely eliminated or substantially reduced. The quadratic-cross Maxwell terms, namely the xz and yz terms in Equation (12c), may still remain. Since the cross terms involve two overlapping physical gradients and one of the two gradients (i.e., the phase-encoding gradient) may change its amplitude throughout the sequence, it is not always practical to use the same Maxwell nulling technique developed for the self-squared Maxwell terms to eliminate the cross terms. Fortunately, the quadratic-cross Maxwell terms often reduce to linear terms, and their phase errors can thus be removed by conventional phase correction methods, such as the one described in U.S. Pat. No. 5,378,985 (January, 1995). Such an example can be found in sagittal images where the xz Maxwell term reduces to a linear z term because x is a constant at a given slice. In cases where the quadratic-cross terms cannot be reduced to a linear term, such as the yz-term in a sagittal image, the cross terms can be nullified if the readout and the phase-encoding gradients do not overlap in the pulse sequence.

Although the above discussion has been mostly focused on sagittal images due to their clinical importance in spine examinations, the same principles are also applicable to other images planes, such as axial and coronal.

Furthermore, the aforementioned techniques for reducing and eliminating the effects of Maxwell terms are not limited to MRI systems with superconducting magnet. Maxwell terms produced by non-superconducting MRI systems, such as those with permanent or resistive magnets, can also be effectively reduced or eliminated using the same principles with only some notational changes. For example, in some resistive magnets, the physical z-axis of the MRI system corresponds to the anterior/posterior direction of the patient, instead of the superior/inferior direction as in the superconducting magnet. Thus, a coronal image lies in the x-y plane, and the slice selection gradient (z-gradient) introduces an $x^2+y^2$ Maxwell term which is 4 times smaller than the $z^2$-term produced by the slice-section gradient (y-axis) in a superconducting magnet. Nonetheless, the effect of the $x^2+y^2$ Maxwell term can be removed by modifying the first right crusher gradient, or by adding a gradient waveform with zero area, as described in the text and illustrated in FIGS. 4 and 7, respectively.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, amplitude and shape of the RF pulses which are to be produced, and the timing and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprising of $G_x$, $G_y$ and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data set. This image data set is conveyed through the serial link 115 to the computer system 107 where it is stored in the disk memory 111. In response to commands received from the operator console 100, this image data set may be archived on the tape drive 112, or it may be further processed by the image processor 106 and conveyed to the operator console 100 and presented on the display 104.

Figure 2:
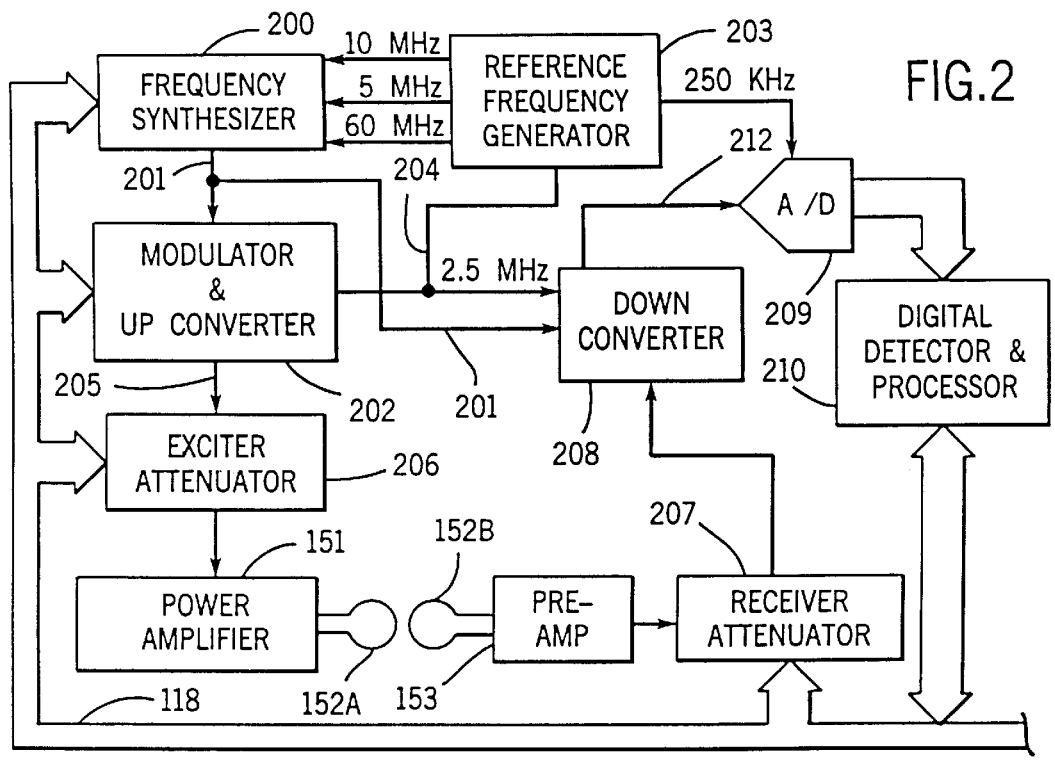
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of another receiver amplifier whose gain is adjusted by an attenuator 207. The receiver amplifier 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
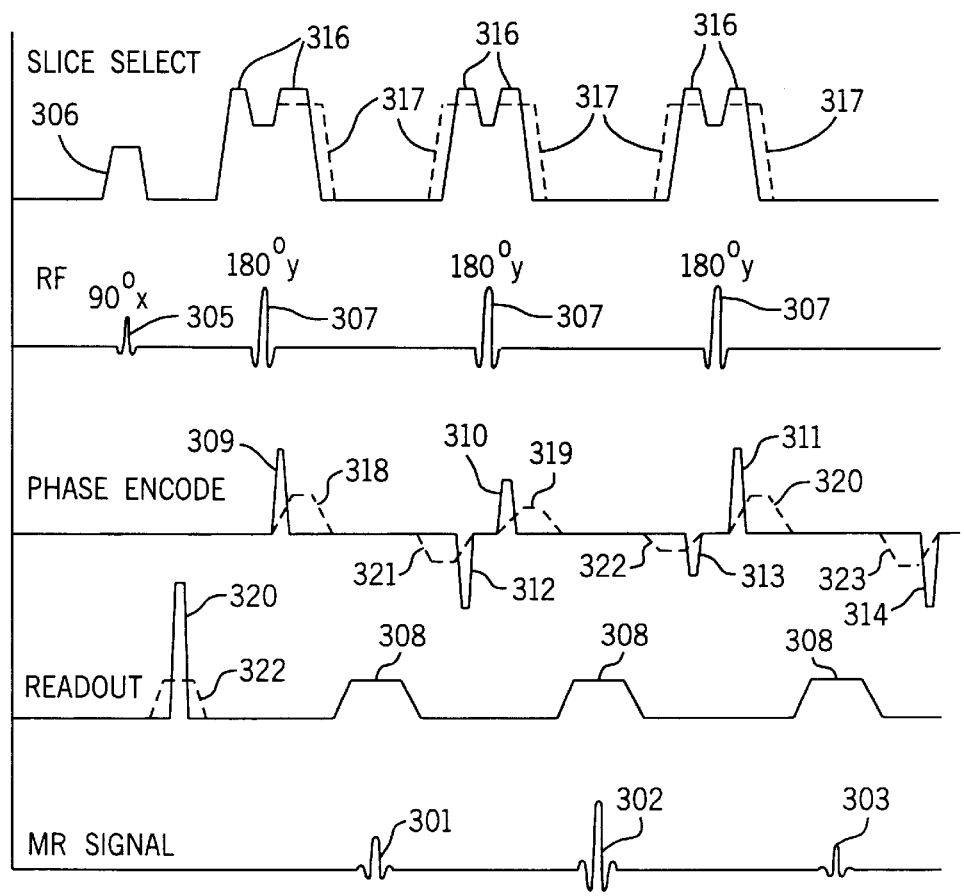
FIG. 3 depicts a conventional FSE pulse sequence (solid lines), and an improved FSE pulse sequence (dashed lines) in accordance with one preferred embodiment of the invention employed by the MRI system of FIG. 1.

Referring particularly to FIG. 3, a conventional fast spin echo NMR pulse sequence (solid lines) is shown. For clarity, only three echo signals 301–303 are shown in FIG. 3, but it can be appreciated that more can be produced and acquired. These NMR echo signals are produced by a 90° RF excitation pulse 305 which is generated in the presence of a $G_z$ slice selection gradient pulse 306 to provide transverse magnetization in a slice through the patient. This transverse magnetization is refocused by each selective 180° RF refocusing pulse 307 to produce the spin echo signals 301–303 that are acquired in the presence of $G_x$ readout gradient pulses 308. Each spin echo signal 301–303 is separately phase encoded by respective $G_y$ phase encoding pulses 309–311. The magnitude of each phase encoding pulse is different, and it is stepped through, for example, 256 values to acquire 256 separate views during a complete scan. This enables an image having 256 separate pixels in the y direction to be reconstructed. Each spin echo signal is acquired by digitizing, for example, 256 samples of each signal. As a result, at the completion of a scan for one image, 16 shots (assuming the echo train length is 16) of the pulse sequence of FIG. 3 have been executed and a 256 by 256 element array of complex numbers has been acquired. In the preferred embodiment crusher gradient pulses 316 as described in U.S. Pat. No. 4,484,138 are also employed. These crusher gradients 316 have an equal area and are produced by the slice select gradient immediately before and after each refocusing RF pulse 307. In addition, rewinder gradient pulses 312 and 314 as described in U.S. Pat. No. 4,665,365 are applied in the phase encoding direction after the respective echo signals 301–303 are acquired.

An image is reconstructed by performing a 2D Fourier transformation on the acquired image data array and then calculating the magnitude of each resulting complex element. A 256 by 256 pixel image is thus produced in which the brightness of each pixel is determined by the magnitude of its corresponding element in the transformed array.

One aspect of the present invention is implemented by altering the right side crusher gradient pulse 316 for the first RF refocusing pulse 307 and both crusher gradient pulses 316 for subsequent RF refocusing pulses 307 as described above and shown in FIG. 5. The resulting adjusted crusher gradient pulses are shown at 317 in FIG. 3. The amplitude is reduced and its width is increased, but does not overlap the production of the readout gradient 308. The adjusted pulse sequence is stored in the pulse generator 121 and it is played out during the scan to control the gradient amplifiers 127 and transceiver 150.

The $G_y$ phase encoding gradient pulses 309–313 are also adjusted and this is particularly important if the operator selects the frequency direction S/I in a sagittal or coronal scan performed in a superconducting magnet with a large field of view. In this case the shape of the phase encoding pulses 309–313 are adjusted such that they have the minimum amplitude that does not increase the minimum echo spacing. This is accomplished by increasing their width such that they are applied over the same time period as the corresponding crusher gradient pulse 316. The resulting phase encoding gradient waveforms indicated at 318, 319 and 320 are stored in the pulse generator 121 and played out during the scan. The same adjustments are made to the rewinder pulses 312–314 as indicated by the corresponding pulses 321, 322 and 323.

The pre-phasing gradient lobe 320 on the readout gradient is also adjusted as described above to reduce the artifacts caused by the self-squared Maxwell term. This is particularly important if the readout gradient axis is along the physical x or y axis, since the coefficient of the $z^2$ term is four times larger than the coefficient of the $x^2+y^2$ term produced by the z-axis gradient. The resulting adjusted pre-phasing readout gradient pulse 322 is stored in the pulse generator 121 and is played out during the scan.

To eliminate the quadratic-cross Maxwell terms, the readout and phase-encoding gradients may also be adjusted for non-axial scans so that they do not overlap throughout the entire sequence. If this results in an unacceptable increase in echo spacing, the overlapping region of the two gradient waveforms should be kept minimal within the constraint of the minimal echo spacing.

We claim:

1. An NMR system, the combination comprising:

means for generating a polarizing magnetic field;

excitation means for generating an RF magnetic field which produces transverse magnetization in spins subjected to the polarizing magnetic field;

receiver means for sensing the NMR signal produced by the transverse magnetization and producing digitized samples of the NMR signal;

first gradient means for generating a first magnetic field gradient to phase encode the NMR signal;

second gradient means for generating a second magnetic field gradient to frequency encode the NMR signal;

third gradient means for generating a third magnetic field gradient to select a region from which NMR signals are acquired; and pulse control means coupled to the excitation means, first gradient means, second gradient means, third gradient means and receiver means, said pulse control means being operable to conduct a scan in which a pulse sequence is conducted to acquire digitized samples of NMR signals which enable an image to be constructed, wherein the pulse control means operates during the scan to perform a fast spin echo pulse sequence in which a series of RF refocusing pulses are produced by said excitation means to produce a corresponding series of NMR spin echo signals, a pair of crusher gradient pulses are produced by the third gradient means surrounding each RF refocusing pulse, and a compensating gradient is produced by said third gradient means during an interval adjacent to the first RF refocusing pulse in said series of RF refocusing pulses to reduce image artifacts produced by Maxwell terms, the compensating gradient is produced by changing the shape of a crusher gradient pulse associated with the first RF refocusing pulse and the crusher gradient pulses associated with RF refocusing pulses after said first RF refocusing pulse are shaped the same as the changed crusher gradient pulse associated with the first RF refocusing pulse.

2. A method for operating an NMR system to perform a fast spin echo pulse sequence, the steps comprising:

a) producing an RF excitation pulse to produce transverse magnetization that generates an NMR signal;

b) producing a slice select gradient pulse concurrently with the rf excitation pulse;

c) producing a series of RF refocusing pulses to generate a corresponding series of NMR spin echo signals;

d) producing a series of slice select gradient pulses concurrently with the respective RF refocusing pulses;

e) producing pairs of substantially identical valued crusher gradient pulses, each pair of crusher gradient pulses being associated with a respective one of the RF refocusing pulses, with one crusher gradient pulse being applied prior to its associated RF refocusing pulse and the other crusher gradient pulse being applied after its associated RF refocusing pulse, one of the crusher gradient pulses in the pair of crusher gradient pulses associated with the first RF refocusing pulse in said series of RF refocusing pulses being adjusted in value to reduce image artifacts produced by Maxwell term errors in the gradient, and one of the crusher gradient pulses in each pair of subsequent crusher gradient pulses associated with RF refocusing pulses after said first RF refocusing pulse being shaped substantially the same as the adjusted crusher gradient pulse associated with the first RF refocusing pulse; and f) acquiring the series of NMR spin echo signals.

* * * * *